United States Patent [19]

Rask et al.

[11] 4,300,027

[45] Nov. 10, 1981

[54] CIRCUIT BREAKER MOTOR OPERATOR VARIABLE DRIVE COUPLING APPARATUS

[75] Inventors: Eric H. Rask, Newington; Roger N. Castonguay, Terryville, both of Conn.

[73] Assignee: General Electric Company, New York, N.Y.

[21] Appl. No.: 160,777

[22] Filed: Jun. 18, 1980

[51] Int. Cl.³ ................................................ H10H 3/30

[52] U.S. Cl. ........................... 200/153 V; 200/153 G; 200/330; 200/153 SC; 335/173; 335/86

[58] Field of Search .............. 200/153 V, 330, 153 G, 200/154, 153 H, 153 SC; 335/86, 173, 68, 186, 17

[56] References Cited

U.S. PATENT DOCUMENTS

| | | | |
|---|---|---|---|
| 2,581,181 | 1/1952 | Favre | 200/153 G |
| 3,508,178 | 4/1970 | Chabaur et al. | 200/153 G |
| 3,689,721 | 9/1972 | McGuffie | 200/153 V |
| 4,042,896 | 8/1977 | Powell et al. | 335/17 |
| 4,153,828 | 5/1979 | Barkan | 200/153 V |
| 4,234,772 | 11/1980 | Rask | 200/330 |
| 4,245,140 | 1/1981 | Jences et al. | 200/153 G |

*Primary Examiner*—Willis Little

*Attorney, Agent, or Firm*—Richard A. Menelly; Walter C. Bernkopf; Philip L. Schlamp

[57] ABSTRACT

Apparatus drivingly couples a rotary motor operator mechanism to a reciprocating circuit breaker operator member such as to provide a braking zone intermediate the end of an operating member charging stroke and the start of an operating member return stroke during which the deactivated motor operator mechanism is brought to a stop without disturbing the operator member in its home position. Apparatus includes a latch for latching the operator member in its home position during the braking zone and a link assembly constructed to accommodate shortening of its effective drive length while a spring absorbs the kinetic energy of the motor operator mechanism. By the conclusion of the braking zone, the operator member is unlatched from its home position, and the spring discharges to propel the operator member to its return stroke while re-establishing the full effective driving length of the link assembly, thereby rendering the operator member charging and return stroke lengths equal.

10 Claims, 6 Drawing Figures

FIG. 5
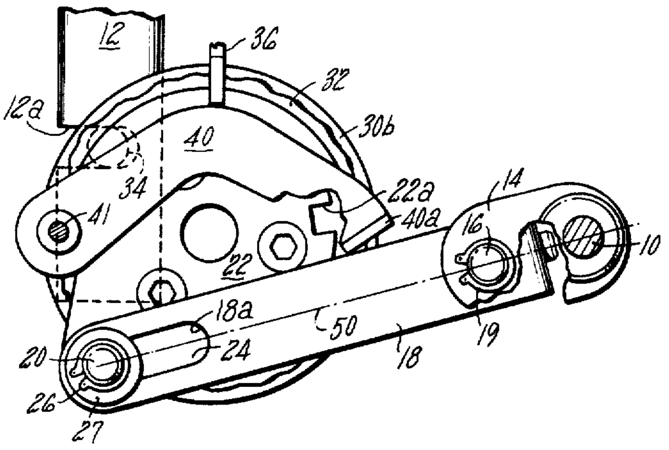
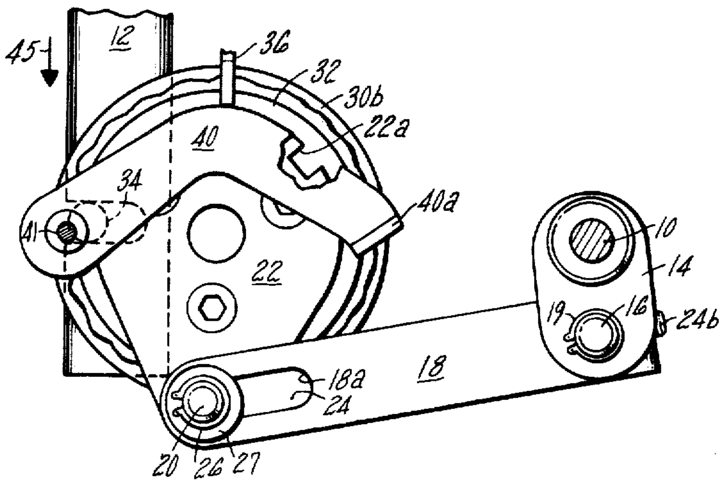
FIG. 6

CIRCUIT BREAKER MOTOR OPERATOR VARIABLE DRIVE COUPLING APPARATUS

BACKGROUND OF THE INVENTION

The present invention relates to motor operator mechanisms having specific, but not necessarily limited application to industrial circuit breakers. More particularly, the present invention relates to variable drive coupling apparatus capable of quickly bringing the de-activated motor operator mechanism to a stop while being effectively drivingly decoupled from the circuit breaker or other instrumentality. Moreover, the present invention is an improvement over the variable drive coupling link assembly of commonly assigned, copending E. H. Rask application Ser. No. 051,587, filed June 25, 1979, now Pat. No. 4,234,772, the disclosure of which is incorporated herein by reference.

In their application to circuit breakers, motor operator mechanisms are utilized in lieu of manual means, such as an operating handle, to charge the breaker's spring powered contact operating mechanism preparatory to contact reclosure after the breaker has been tripped open. Typically, the motion of the motor operator mechanism must be rather precisely tailored to a particular breaker's contact operating mechanism. This is particularly so with regard to the start and stop positions of the motor operator mechanism. Typically, these start and stop positions are virtually one in the same, termed a "home" position. Under these circumstances, it is essential that the motor operator mechanism stop rather precisely in its home position at the conclusion of a charging cycle in order that it be in the proper position to start the next charging cycle. To achieve this, prior art motor operator mechanisms have utilized braking techniques, either mechanical braking or both, which are effectuated essentially coincidentally with motor de-energization as the motor operator mechanism arrives at its home position. While these braking techniques are generally effective in abruptly stopping a motor operator mechanism within acceptable limits of its home position, they do indeed add cost and complexity to the motor operator mechanism. Moreover, any braking technique poses potential field service problems.

It is accordingly an object of the present invention to provide an improved apparatus for variably drivingly coupling a motor operator mechanism with an operator member of an instrumentality.

A further object is to provide variable drive coupling apparatus of the above character operating to decouple the motor operator mechanism from the operator member at the conclusion of an operating cycle and thus eliminate the need to abruptly stop motor operator mechanism at a predetermined position.

Another object is to provide variable drive coupling apparatus of the above character operating to automatically establish a resilient lost motion coupling between the motor operator mechanism and the operator member at the conclusion of each operating cycle and thereby effectuate a braking zone during which the deactivated motor operator mechanism is brought to a stop without disturbing the position of the operator member.

Still another object is to provide variable drive coupling apparatus of the above character wherein, during the braking zone, the operator member is latched in its home position while the kinetic energy of the deactivated motor operator mechanism is absorbed, and wherein at the conclusion of the braking zone the operator member is unlatched from its home position and the absorbed kinetic energy is then discharged to propel the operator member into an operating cycle.

Yet another object is to provide variable drive coupling apparatus of the above character operating to automatically compensate for the effects of the lost motion connection during each operating cycle and thus achieve uniformity of operator member movement.

A further object is to provide variable drive coupling apparatus of the above character which is efficient in design and reliable in operation.

Other objects of the invention will in part be obvious and in part appear hereinafter.

SUMMARY OF THE INVENTION

In accordance with the present invention, there is provided apparatus for variably drivingly coupling a motor operator mechanism with a circuit breaker operating mechanism. The circuit breaker includes an operator member which is driven through a charging cycle by the motor operator mechanism via the variable drive coupling apparatus and the operator member is, in turn, drivingly coupled with the breaker spring powered operating mechanism to charge same. At the completion of a charging cycle, the operator member arrives at a home position. The variable drive coupling is then effective to decouple the motor operator mechanism from the operator member and thus create a zone during which the deactivated motor operator mechanism can be brought to a stop without disturbing the operator member in its home position. When the motor operator mechanism is subsequently reactivated, the variable drive coupling apparatus automatically re-establishes drive coupling with the operator member at the end of the zone and it is propelled through its charging cycle.

More specifically, the variable drive coupling apparatus includes a link assembly incorporating a resilient lost motion joint operative to accommodate a shortening of the effective driving length of the link assembly at the conclusion of each charging cycle. With the arrival of the operator member at its home position, latch means is effectuated to hold the operator member stationary as the apparatus enters a braking zone. Spring means incorporated in the lost motion joint absorbs the kinetic energy of the de-activated motor operator mechanism, bringing it to a complete stop prior to the conclusion of the braking zone. When the motor operator mechanism is reactivated, the apparatus is motivated through to the end of the braking zone, by which time the latch means has been automatically actuated to release the operator member from its home position. The spring means discharges to propel the operator member into a charging cycle and, at the same time, re-establishes the full effective driving length of the link assembly by taking up the play in the lost motion joint.

Preferably, the operator member is slideably mounted for rectilinear movement from its home position through a rearward return stroke and then a forward charging stroke back to its home position during each charging cycle in response to each revolution of the motor operator mechanism. The driving length, which is allowed to shorten at the conclusion of the operator member charging stroke to create the braking zone, is restored to its full effective length by the spring means when the operator member is unlatched from its home position at the conclusion of the braking zone. The full effective driving length is then maintained for the remainder of the return stroke and throughout the charging stroke. Consequently, the braking zone is provided while maintaining the return and charging strokes of the operator member of equal lengths.

The invention accordingly comprises the features of construction and arrangement of parts which will be exemplified in the construction hereinafter set forth, and the scope of the invention will be indicated in the claims.

For a better understanding of the nature and objects of the invention, reference should be had to the following detailed description taken in conjunction with the accompanying drawings, in which:

DESCRIPTION OF THE DRAWINGS

FIG. 5 is a plan view of the variable drive coupling apparatus of FIG. 1 illustrating its condition midway through an operator member charging stroke;

FIG. 6 is a plan view of the variable drive coupling apparatus of FIG. 1 depicting its condition midway through an operator member charging stroke back to its home position.

Corresponding reference numerals refer to like parts throughout the several views of the drawings.

DETAILED DESCRIPTION

Figure 1:
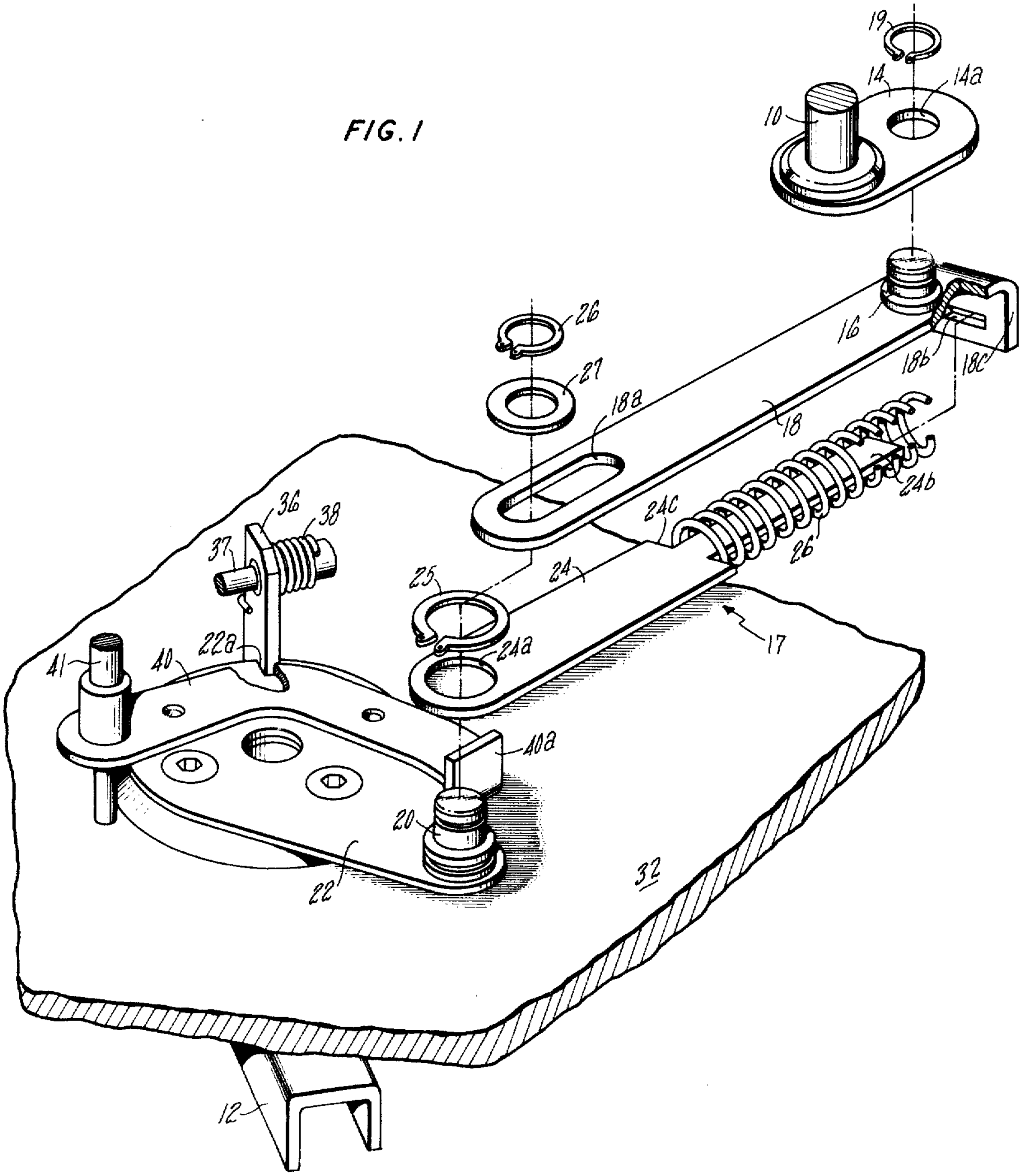
FIG. 1 is an exploded, perspective view of the variable drive coupling apparatus of the present invention.
Figure 3:
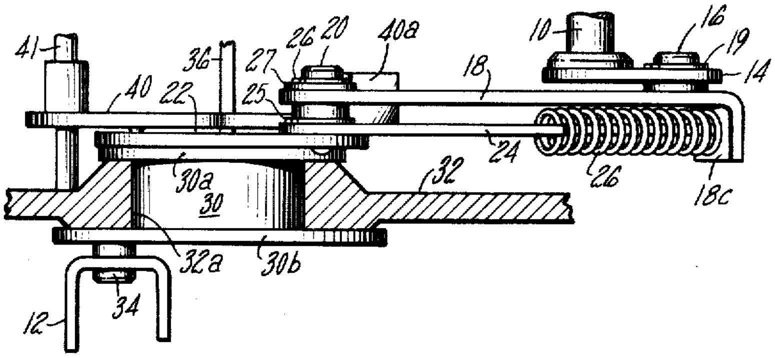
FIG. 3 is a side view, partially in section, of the variable drive coupling apparatus of FIG. 2.

Referring to FIG. 1, the variable drive coupling apparatus of the present invention couples a rotary output shaft 10 of a motor operator mechanism (not shown) with a reciprocating circuit breaker operator member or slide 12, such that, with each revolution of the output shaft, the operator member is propelled from a home position through a light loaded, rearward return stroke and a heavily loaded, forward charging stroke back to the home position. The motor operator mechanism may be of the construction shown in commonly assigned U.S. Pat. No. 4,042,896, while operator member 12 may be operatively coupled to charge a circuit breaker mechanism of the construction shown in the above-noted copending application Ser. No. 051,587 (U.S. Pat. No. 4,234,772). Affixed to output shaft 10 is a crank arm 14 whose free end is provided with a hole 14*a* in which is received a pin 16 carried adjacent one end of a link 18 included in a link assembly, generally indicated at 17. A snap ring 19 captures pin 16 in hole 14*a* to pivotally connect the crank arm to the link. The other end of this link is provided with a longitudinally elongated slot 18*a* in which is received a pin 20 carried adjacent the free end of a crank arm 22. Positioned below link 18 is a link 24 of link assembly 17 which is provided at one end with a hole 24*a* for receipt of pin 20. The other end portion of this link is necked down to create an elongated tang 24*b* whose free end is slidingly received in a slot 18*b* formed in the bent down end portion 18*c* of link situated beyond pin 16. A compression spring 26 is received on tang 24*a* and is captured between the shoulders 24*c* of link 24 and bent down end portion 18*c* of link 18. As seen in FIGS. 1 and 3, pin 20 is shouldered such that link 24 is captured on its larger diameter lower portion by a snap ring 25, while link 18 is captured on its reduced diameter upper portion by a snap ring 26 and intervening spacer washer 27.

Figure 2:
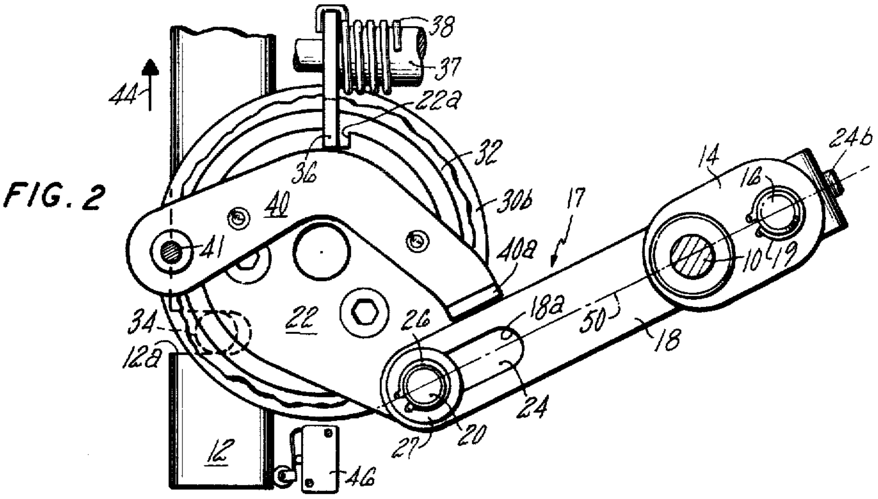
FIG. 2 is a plan view of the variable drive coupling apparatus of FIG. 1 depicting its condition at the conclusion of a charging stroke and beginning of a braking zone with a circuit breaker operator member latched in its home position.

As best seen in FIG. 3, crank arm 22 is secured to an upper plate 30*a* of a hub 30 rotatably mounted in an opening 32*a* formed in an insulative breaker cover member 22. A lower plate 30*b* of the hub carries a depending, eccentric drive pin 34 which is received in a laterally elongated slot 12*a* formed in operator slide 12, as seen in FIG. 2. A latch 36, best seen in FIGS. 1 and 2, is pivotally mounted by a horizontal shaft 37 and is biased by a torsion spring 38 to swing into engagement with a notch 22*a* formed in an arcuate edge segment of crank arm 22, thereby latching the crank arm against rotation when operator slide 12 arrives in its home position. A latch release arm 40 is pivotally mounted on the upper end of a vertical shaft 41 and includes an upturned tab 40*a* at its free end which is acted upon by the link assembly 17 to disengage latch 36 from notch 22*a*.

As will be seen in the following description in conjunction with FIGS. 2 and 4 through 6, a motor operator mechanism charging cycle is executed by swinging crank arm 14 through a full 360° revolution. During the initial portion of each crank arm 360° revolution, operator slide 12, once unlatched from its home position of FIG. 2, is propelled in the direction of arrow 44 through a return stroke. During the concluding portion of each 360° revolution, slide 12 is driven in the direction of arrow 45 (FIG. 6) through a charging stroke back to its home position. As will be seen, link assembly 17 acts on pin 20 to provide a spring biased lost motion coupling between crank arms 14 and 22 which is effectuated at the conclusion of the slide charging stroke to decouple crank arms while the slide is latched in its home position. This lost motion coupling provides a braking zone during which the kinetic energy of the motor operator mechanism, which is then deactuated by a normally closed switch 46 (FIG. 2) being actuated in response to the arrival of slide 12 in its home position, is absorbed by spring 26. The motor operator mechanism is thus quickly brought to a stop while the operator slide is latched in its home position achieved at the conclusion of its charging stroke. By virtue of this braking zone, the necessity for special braking provisions to abruptly stop the rotation of the motor output shaft precisely at the conclusion of a charging cycle are rendered unnecessary. This contributes a distinct advantage in terms of design efficiency and field reliability. Paradoxically, it will be seen that this coasting zone is achieved while maintaining equal clockwise and counterclockwise throws of crank 22, and thus the lengths of the return and charging strokes of operator slide 12 are equal.

The variable drive coupling parts are shown in FIG. 2 with the axes of output shaft 10, pin 16 and pin 20 in alignment along a center line 50. Since pin 16 is aligned on the opposite side of output shaft 10 from pin 20, crank arm 22 has arrived at the end of its counterclockwise throw, and operator slide 12 has reached its home position at the end of its forward charging stroke. It is noted that pin 20 is bottomed against the left end of slot 18*a* in link 18, and edge notch 22*a* in crank arm 22 is aligned with latch 36; the latter being swung into engagement therewith by torsion spring 38. Although the motor operator mechanism has been deactivated by the actuation of switch 46, its kinetic energy rotates crank arm 14 in the counter-clockwise direction away from center line 50. Since the latched crank arm 22 can not move, pin 20 moves away from the left end of slot 18*a* and link assembly 17 is simply swung in the counterclockwise direction. With the resulting shortening of the link assembly driving length (distance between pins 16 and 20), spring 26 is compressed to effectively absorb the kinetic energy of the deactivated motor operator mechanism and quickly bring it to a complete stop. There is thus provided a resilient lost motion connection between crank arm 22 and link assembly 17 effective in creating a braking zone 51 through which crank arm 14 may revolve as the lost motion connection yields to absorb the kinetic energy of the deactivated motor operator mechanism. The motor operator mechanism is thus quickly braked to a stop, well before the end of the braking zone determined by the length of slot 18*a* in link 18.

The utilization of a resilient lost motion coupling in combination with latching of the operator slide in its home position is deemed an improvement over the variable drive coupling assembly of the above-noted Rask copending application, wherein a lost motion coupling is utilized to create a coasting zone during which the motor operator mechanism is simply permitted to coast to a stop without disturbing the operator slide in its home position. With the latter approach, it has been found on occasion that the motor operator mechanism coasts beyond the coasting zone before coming to a stop, resulting in undesired displacement of the operator slide from its home position.

Figure 4:
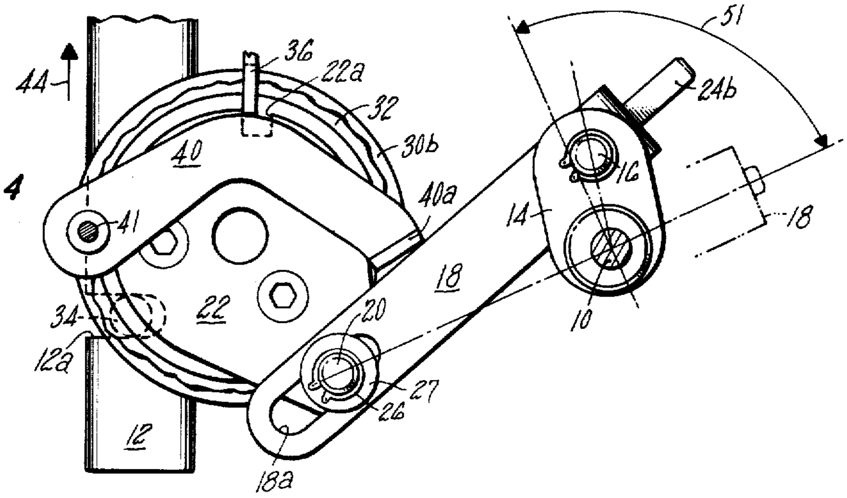
FIG. 4 is a plan view of the variable drive coupling apparatus of FIG. 1 depicting its condition just prior to the end of the braking zone.

From FIG. 4, it is seen that as link assembly 17 is swung in the counterclockwise direction during the braking zone, it picks up latch release arm 40, swinging it also in the counterclockwise direction. In the process, this arm progressively pushes latch 36 out of notch 22*a*. However, the motor operator mechanism is braked to a stop by the compression of spring 26 before link assembly 17 achieves its position seen in FIG. 4. Thus latch 36 remains lodged in notch 22*a* to continue latching the operator slide in its home position. When a charging cycle is called for, the motor operator mechanism is activated, and crank arm 14 is revolved through the remainder of the braking zone. The link assembly is swung in the counterclockwise direction, as is arm 40 to eventually effect complete disengagement of the latch from its notch. To eliminate interference, the configuration of arm 40 is such that complete disengagement of latch 36 from notch 22*a* is effected prior to the conclusion of the braking zone 51 defined by the bottoming of pin 20 against the right end of slot 18*a* in link 18. It will be appreciated that, with the removal of the latch, spring 26 is free to discharge, which it does, in process propelling crank arm 22 in the clockwise direction to start operator slide 12 out from its home position into a return stroke. The discharge of the spring also restores the link assembly to its full effective driving length with pin 20 bottomed against the left end of link slot 18*a* which is sustained by the spring throughout the clockwise throw of crank arm 22 to the conclusion of the operator slide return stroke where the parts assume their positions seen in FIG. 5.

With continued counterclockwise rotation of crank arm 14 by the motor operator mechanism from its position seen in FIG. 5, it is seen that pin 20 is bottomed against the left end of slot 18*a* in link 18, and crank arm 22 is pulled through its counterclockwise throw pursuant to propelling operator slide 12 in the direction of arrow 45 (FIG. 6) through its forward charging stroke. When crank arm 14 swings back around to its position seen in FIG. 2, bringing the axis of pin 16 back into alignment with center line 50, the charging stroke is concluded. Slide 56 is thus returned to its home position, latch 36, which has been riding against the arcuate edge segment of crank arm 22 throughout the charging cycle, swings into engagement with notch 22*a*, and switch 46 is actuated to deactivate the motor operator mechanism. The motor operator mechanism is braked to a stop by spring 26, as crank arm 14 revolves into the braking zone.

It will be appreciated that the operational effect of the link assembly can be provided in other ways to achieve the desired braking zone. For example, the spring biased, lost motion coupling may be provided at the connection of the link assembly with crank arm 14, rather than with crank arm 22, as specifically disclosed herein. Also, the latch may latchingly engage the operator slide directly or an element of hub 30 pursuant to latching the slide in its home position during the braking zone.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described the invention, what is claimed as new and desired to secure by Letters Patent is:

1. In a circuit breaker equipped with a motor operator mechanism functioning to reciprocate a circuit breaker operator member through an operating cycle consisting of a first stroke in one direction away from a home position and a second stroke in the opposite direction back to the home position, the motor operator mechanism including a unidirectionally rotating output shaft to which is affixed a first crank arm, and a second crank arm drivingly coupled with the operator member, variable drive coupling apparatus comprising, in combination:

A. linkage means drivingly interconnecting the first and second crank arms such that, for each revolution of the first crank arm, the second crank arm is propelled through successive, oppositely directed throws effective in motivating the operator member through its first and second strokes;

B. switch means acting in response to the arrival of the operating member at its home position at conclusion of the second stroke to deactivate the motor operator mechanism;

C. latch means operative to latch the operator member in its home position upon its arrival thereat at the conclusion of the second stroke and to unlatch the operator member from its home position in response to reactivation of the motor operator mechanism to begin an operating cycle;

D. a lost motion coupling between said linkage means and one of the crank arms for establishing a full effective driving length in said linkage means to propel the operator member through its second stroke, upon arrival of the operator member at its home position, said coupling accommodating a reduction in the effective driving length of said linkage means, the limits of said lost motion coupling defining a braking zone through which the first crank arm may revolve while the operator member is latched in its home position by said latch means;

E. resilient means acting in opposition to the reduction of the linkage means effective driving length during said braking zone for absorbing the kinetic energy of the deactivated motor operator mechanism, upon unlatching of the operator member from its home position prior to the arrival of the first crank at the end of said braking zone, said resilient means discharging its absorbed energy to propel the operator member into its first stroke and to restore and maintain the full effective driving length of said linkage means for the remainder of the first stroke and throughout the second stroke.

2. The variable drive coupling apparatus defined in claim 1, wherein said resilient means is a spring.

3. The variable drive coupling apparatus defined in claim 2, wherein said latch means includes a latching element and an unlatching element, said unlatching element actuating said latching element to unlatch the operator member from its home position in response to the approach of the first crank arm to the end of said braking zone.

4. The variable drive coupling apparatus defined in claim 3, wherein said unlatching element actuates the latching element to unlatch the operator member from its home position in response to engagement by said linkage means.

5. The variable drive coupling apparatus defined in claim 2, wherein said linkage means includes an elongated, rigid first link pivotally connected adjacent one end to the free end of one of the crank arms, said lost motion coupling comprising a pin eccentrically mounted by the other of the crank arms and received in a longitudinally elongated slot formed in the other end of said link, and said spring biasing said second pin against the end of said slot remote from the pivotal connection of said link with the one crank arm.

6. The variable drive coupling defined in claim 5, wherein said linkage means includes an elongated, rigid second link pivotally connected at one end to said pin, said spring being a compression spring carried by said second link and acting between said first and second links.

7. The variable drive coupling defined in claim 6, wherein said second link is necked down intermediate its ends to provide a tang portion extending away from its one end and projecting through a slot formed in a laterally turned portion of said first link disposed in displaced relation to said slot therein, said spring carried on said tang portion and held captive between said laterally turned first link portion and shoulders created at the junction of said tang portion with said second link.

8. The variable drive coupling apparatus defined in claim 5, wherein said latch means includes a latching element and an unlatching element, said unlatching element actuating said latching element to unlatch the operator member from its home position in response to the approach of the first crank arm to the end of said braking zone.

9. The variable drive coupling apparatus defined in claim 8, wherein said unlatching element actuates the latching element to unlatch the operator member from its home position in response to engagement by said linkage means.

10. The variable drive coupling apparatus defined in claim 9, wherein said latching element is biased into engagement with an arcuate edge portion of the second crank arm, and a notch created in said arcuate edge portion into which said latching element is lodged upon the second crank arm achieving an angular position corresponding with the home position of the operator member.

* * * * *